United States Patent
Buonodono et al.

(10) Patent No.: US 7,453,069 B2
(45) Date of Patent: Nov. 18, 2008

(54) BUSHING UNIT WITH INTEGRATED CONDUCTOR IN ION ACCELERATING DEVICE AND RELATED METHOD

(75) Inventors: James P. Buonodono, Amesbury, MA (US); Edward W. Bell, Newbury, MA (US); Piotr Lubicki, Peabody, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 238 days.

(21) Appl. No.: 11/567,400

(22) Filed: Dec. 6, 2006

(65) Prior Publication Data

US 2008/0135783 A1    Jun. 12, 2008

(51) Int. Cl.
*H01J 37/317*    (2006.01)

(52) U.S. Cl. .............................. 250/396 R; 250/492.21

(58) Field of Classification Search ............ 250/396 R, 250/492.21
See application file for complete search history.

(56) References Cited

U.S. PATENT DOCUMENTS

| 5,483,077 | A  | * | 1/1996 | Glavish ................ 250/492.2 |
| 7,112,809 | B2 | * | 9/2006 | Rathmell et al. ....... 250/492.21 |

* cited by examiner

*Primary Examiner*—Kiet T Nguyen

(57) ABSTRACT

An ion accelerating device includes a series of bushing units and a series of resistor circuit units. Each resistor circuit unit is coupled to one bushing unit. A bushing unit includes three integrated conductors to establish connections to the coupled resistor circuit unit and to an immediately adjacent bushing unit such that a voltage to the bushing unit may be degraded by the resistor circuit unit before reaching the lens and that two bushing units may contact one another directly.

20 Claims, 5 Drawing Sheets

BUSHING UNIT WITH INTEGRATED CONDUCTOR IN ION ACCELERATING DEVICE AND RELATED METHOD

BACKGROUND OF THE INVENTION

1. Technical Field

The present invention relates generally to ion implantation, and more particularly, to an ion accelerating device including a bushing unit with integrated conductors, and related method.

2. Related Art

Ion implantation is a standard technique for introducing conductivity altering impurities into, or doping, semiconductor wafers. A typical ion implantation process uses an energetic ion beam to introduce impurities (ions) into semiconductor wafers. During ion implantation, a source feed material is energized to generate an ion beam, and the generated ion beam needs to be accelerated by an acceleration column. An acceleration column is required to accelerate an ion beam of 670 kV. Preferably, the acceleration is accomplished by the ion beam passing through seven lenses internal to the acceleration column with voltages graded across the lenses. However, the currently available physical spacing between adjacent lenses is insufficient to follow the proper high voltage design rules under the conventional design practice for an acceleration column.

SUMMARY OF THE INVENTION

An ion accelerating device includes a series of bushing units and a series of resistor circuit units. Each resistor circuit unit is coupled to one bushing unit. A bushing unit includes three integrated conductors to establish connections to the coupled resistor circuit unit and to an immediately adjacent bushing unit such that a voltage to the bushing unit may be degraded by the resistor circuit unit before reaching the lens and that two bushing units may contact one another directly.

A first aspect of the invention is directed to an ion accelerating device of an ion implantation system, the ion accelerating device comprising: a first bushing unit including a first conductor, a second different conductor and a lens mounting plate; and a first resistor circuit unit coupled to the first bushing unit; wherein the first conductor connects an input terminal of the first bushing unit to an input terminal of the first resistor circuit unit, and the second conductor connects an output terminal of the first resistor circuit unit to an input terminal of the lens mounting plate.

A second aspect of the invention is directed to an accelerating column bushing unit, the bushing unit comprising: a lens mounting plate; and a first conductor and a second different conductor; wherein the first conductor connects an input terminal of the bushing unit to an input terminal of a resistor circuit unit coupled to the bushing unit, and the second conductor connects an output terminal of the resistor circuit unit to an input terminal of the lens mounting plate.

A third aspect of the invention is directed to a method of providing a voltage supply to a lens in an ion accelerating device, the method comprising: providing a series of bushing units and a series of resistor circuit units, each resistor circuit unit coupled to one bushing unit, each bushing unit including a first conductor, a second different conductor and a lens mounting plate; connecting an input terminal of one bushing unit to an input terminal of a respective resistor circuit unit using the first conductor; and connecting an output terminal of the respective resistor circuit unit to an input terminal of the lens mounting plate of the bushing unit using the second conductor to provide voltage to a lens installed on the lens mounting plate.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

It is noted that the drawings of the invention are not to scale. The drawings are intended to depict only typical aspects of the invention, and therefore should not be considered as limiting the scope of the invention. In the drawings, like numbering represents like elements among the drawings.

DETAILED DESCRIPTION

1. Ion Implantation System Overview

Figure 1:
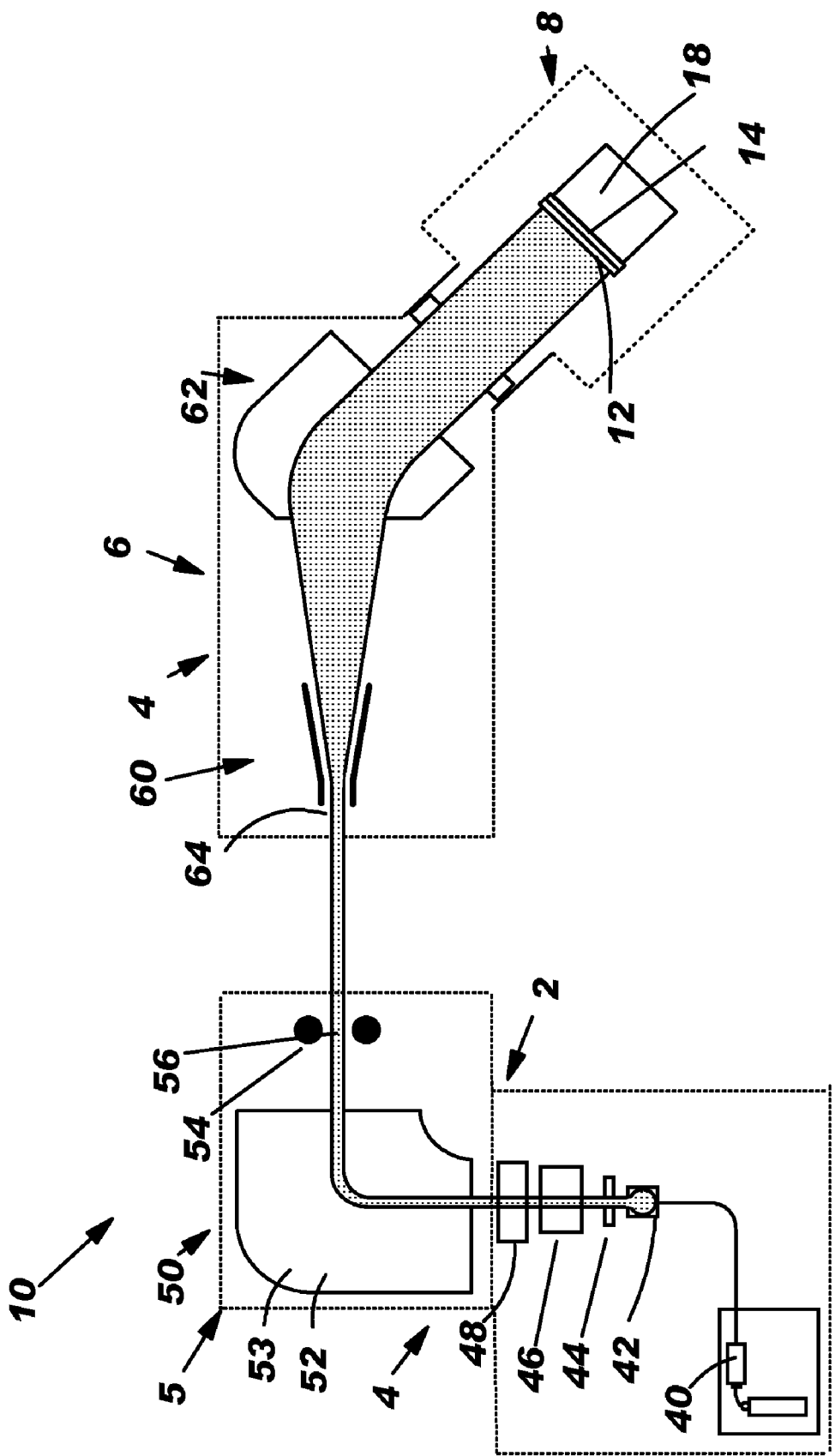
FIG. 1 shows a schematic view of an ion beam implantation system according to one embodiment of the invention.

With reference to the accompanying drawings, FIG. 1 shows an illustrative ion implantation system 10. Ion implantation system 10 includes an ion beam generating sub-system 2 for generating and transmitting an ion beam 4, through ion beam filtering sub-system 5, ion beam scanning sub-system 6, to a target sub-system 8. Ion beam generating sub-system 2 may include any now known or later developed ion beam generator such as those available from Varian Semiconductor Equipment Associates. Typically, target sub-system 8 includes one or more semiconductor targets 12 (e.g., a wafer) mounted to a platen 14. Characteristics of platen 14 and, hence, target 12, may be controlled by a platen drive assembly (not shown) that rotates target 12, and by a target vertical scan position controller 18 that controls the vertical position of target 12. Ion implantation system 10 may include additional components known to those skilled in the art. It will be understood that the entire path traversed by ion beam 4 is evacuated during an ion implantation.

Besides the above-described components, ion beam generating sub-system 2 may include a gas flow 40, an ion beam source 42, an extraction manipulator 44, a source filter magnet 46, and an accelerating/decelerating column 48. Source filter magnet 46 is preferably positioned in close proximity to ion beam source 42. Extraction manipulator 44 is positioned between source filter magnet 46 and ion beam source 42. Acceleration/deceleration column 48 is positioned between source filter magnet 46 and mass analyzer 50.

Ion beam filtering sub-system 5 may include a mass analyzer 50 including, for example, a dipole analyzing magnet 52 with a semicircle radius 53, a mass resolving slit 54 having a resolving aperture 56. As is well known in the art, ion beam 4 may include different combinations of ions in different stages of the path it traverses.

Scanning sub-system 6 may include, for example, a scanner 60 and an angle corrector 62. Scanner 60, which may be an electrostatic scanner, deflects filtered ion beam 4.

Although an illustrative ion implantation system 10 has been illustrated above, it should be understood by those skilled in the art that any now known or later developed system to generate and scan ion beam 4 may be used for the current invention. It should be understood that the current invention can be used with any now known or later developed process and methods of ion implantation.

2. Ion Accelerating Device

Figure 2:
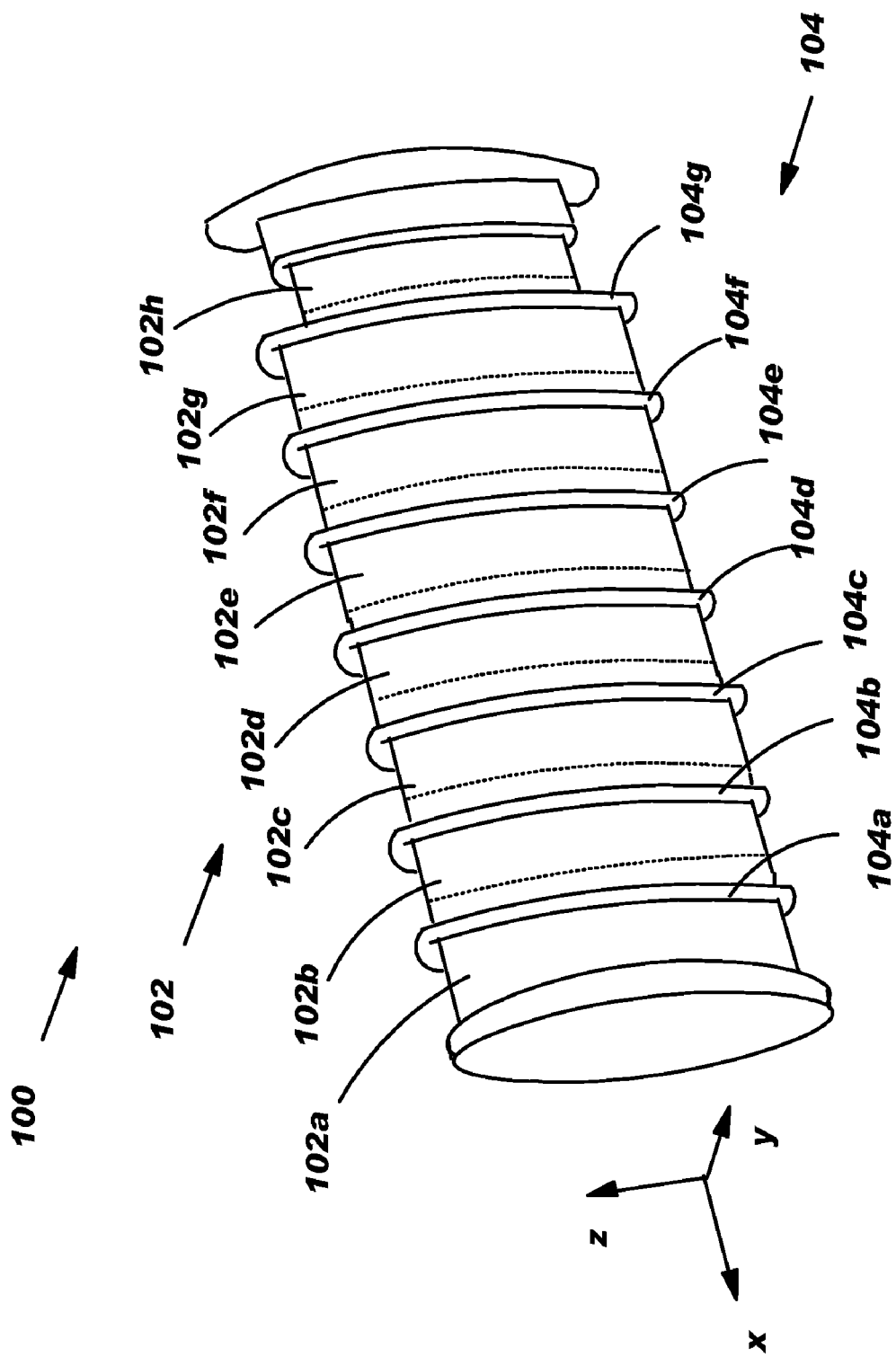
FIG. 2 shows a schematic three-dimensional view of an ion accelerating device according to one embodiment of the invention.

Referring to FIG. 2, a schematic three-dimensional view of an ion accelerating device 100 is shown. Accelerating device 100 may implement accelerating/decelerating column 48 of FIG. 1. According to one embodiment, ion accelerating device 100 includes multiple (or a series of) accelerating column bushing units (bushing unit) 102 (8 are shown) and multiple (or a series of) resistor circuit units 104 (7 are shown). Each resistor circuit unit 104 may be attached/coupled to one bushing unit 102 at the outside of the latter. Bushing units 102 and resistor circuit units 104 may not correspond one-to-one. For example, some bushing units 102 may not be coupled to resistor circuit units 104. A resistor circuit unit 104 functions to, e.g., degrade an input voltage by a preset amount and output a degraded voltage at its output terminal. That is, an output voltage of a resistor circuit unit 104 is lower than an input voltage thereof by a preset amount. The preset degrading amount is controllable and adjustable. According to one embodiment, a resistor circuit unit 104 degrades an input voltage by approximately 95 kV.

According to one embodiment, as shown in FIG. 2, ion accelerating device 100 includes eight bushing units 102 (102*a* to 102*h*) coupled at one end to, e.g., a filter magnet 46 of FIG. 1, and coupled at the other end to, e.g., mass analyzer 50 of FIG. 1. Each two immediately adjacent bushing units 102, e.g., 102*a* and 102*b*, contact one another directly. That is, there is no physical spacing between two immediately adjacent bushing units 102. Seven resistor circuit units 104 (104*a*-104*g*) are coupled, one-to-one, to the first 7 bushing units 102 (102*a*-102*g*). In FIG. 2, the dotted lines indicate the direct contacts between the immediately adjacent bushing units 102.

Figure 3:
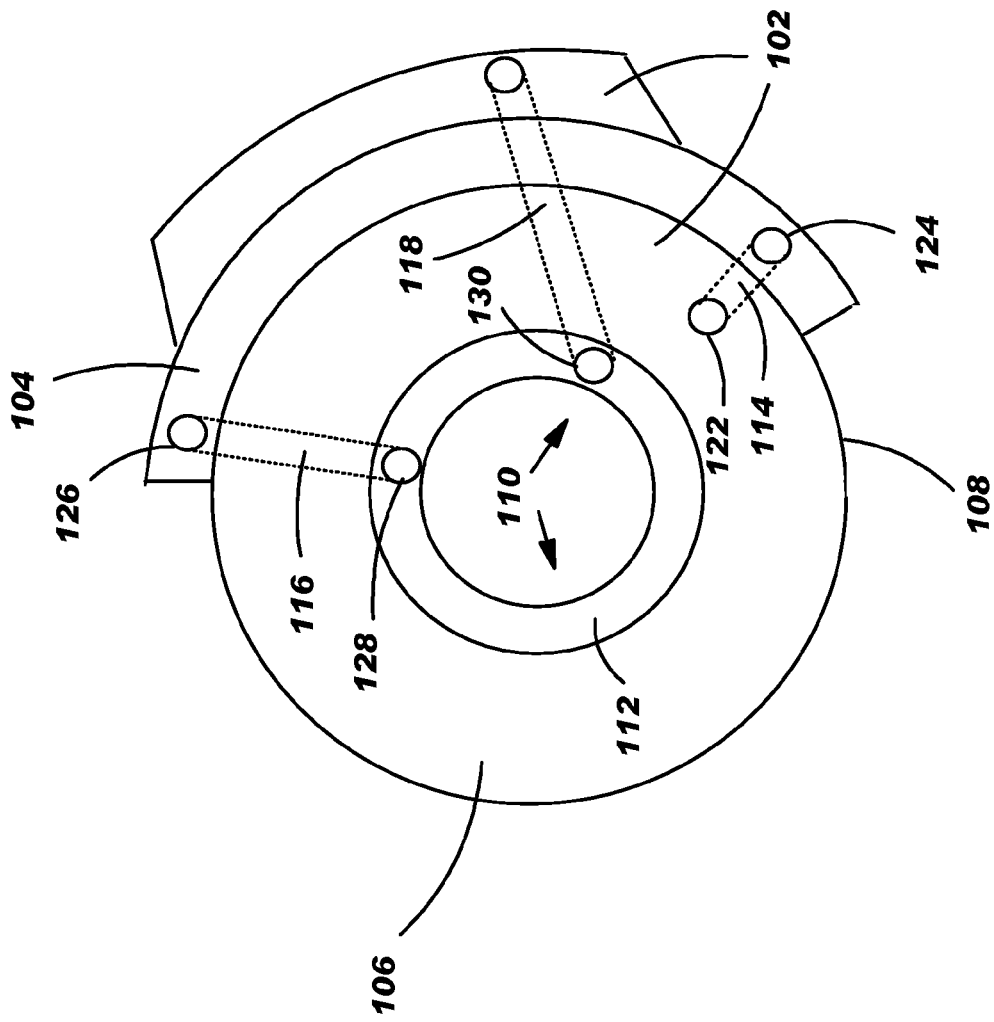
FIG. 3 shows a schematic three-dimensional view of a bushing unit with a cross-sectional view in one plane according to one embodiment of the invention.

Turning to FIG. 3, a three dimensional view of a bushing unit 102 is shown with a cross-sectional view in the y-z plane (FIG. 2). As shown in FIG. 3, bushing unit 102 includes a hollow shaped base 106 of insulation materials. All other components of bushing unit 102 are all positioned within base 106. Base 106 includes an exterior surface (outside) 108 that contacts the atmosphere, and an interior surface (inside) 110 that contacts a high vacuum interior environment. FIG. 3 shows that bushing unit 102, specifically base 106, has an approximately circular overall shape for illustration purposes. It should be appreciated that other shapes of base 106 are also possible and are included in the invention. Resistor circuit unit 104 is coupled to, e.g., mounted to, bushing unit 102 at exterior surface (outside) 108. Bushing unit 102 includes a lens mounting plate 112 on interior surface (inside) 110. As is appreciated, lens mounting plate 112 functions to mount and provide voltage to a lens 146 (shown in FIG. 5).

As shown in FIG. 3, bushing unit 102 includes an input conductor 114, an intermediate conductor 116, and an output conductor 118. The dotted lines of conductors 114, 116 and 118 indicate that they are positioned within base 106. Input conductor 114 connects an input terminal 122 of bushing unit 102 to an input terminal 124 of resistor circuit unit 104. The connection may be implemented in any manner, and all are included in the invention. For example, input conductor 114 and input terminal 122 of bushing unit 102 may be integrated. That is, input terminal 122 is part of input conductor 114. In addition, the connection between input conductor 114 and input terminal 124 of resistor circuit unit 104 may be implemented by mating features of the two. For example, input conductor 114 may include a threaded hole to mate with/receive a threaded fastener passing through input terminal 124 of resistor circuit unit 104. Please note, in the current description, the terms "input terminal" and "output terminal" are all defined with respect to voltage paths to and through the respective units and components (e.g., bushing units 102, resistor circuit units 104, and lens mounting plates 112). For example, input terminal 122 of bushing unit 102 receives voltage input to bushing unit 102.

Intermediate conductor 116 connects an output terminal 126 of resistor circuit unit 104 and an input terminal 128 of lens mounting plate 112. Similar to input conductor 114, intermediate conductor 116 may be integrated to input terminal 128 of lens mounting plate 112, and may have a mating feature, e.g., a projection portion, to be mated with a respective mating feature, e.g., a recess portion, of output terminal 126 of resistor circuit unit 104. It should be appreciated that the scope of the invention is not limited by any specific manner of connection.

Output conductor 118 is coupled to an output terminal 130 of lens mounting plate 112. According to one embodiment, output conductor 118 is integrated to output terminal 130 of lens mounting plate 112. Output conductor 118 is also designed to be coupled to an input terminal 122 of another bushing unit 102 (shown in FIG. 4) such that when two bushing units 102, e.g., 102*a* and 102*b* of FIG. 2, are assembled together as in ion accelerating device 100 of FIG. 2, output conductor 118 of bushing unit 102*a* connects output terminal 130 of lens mounting plate 112 of bushing unit 102*a* to input terminal 122 of bushing unit 102*b*. The coupling between output conductor 118 of bushing unit 102*a* and input terminal 122 of bushing unit 102*b* is direct such that bushing units 102*a* and 102*b* include no physical spacing therebetween. According to one embodiment, output conductor 118 of bushing unit 102*a* and input terminal 122 of bushing unit 102*b* include mating features to mate with one another. For example, output conductor 118 of bushing unit 102*a* may include a projection portion, e.g., an alignment pin, to be received by a recess portion of input terminal 122 of bushing unit 102*b*. According to one embodiment, the alignment pin of output conductor 118 is movable to facilitate the coupling between output conductor 118 of bushing unit 102*a* and input terminal 122 of bushing unit 102*b*.

Figure 4:
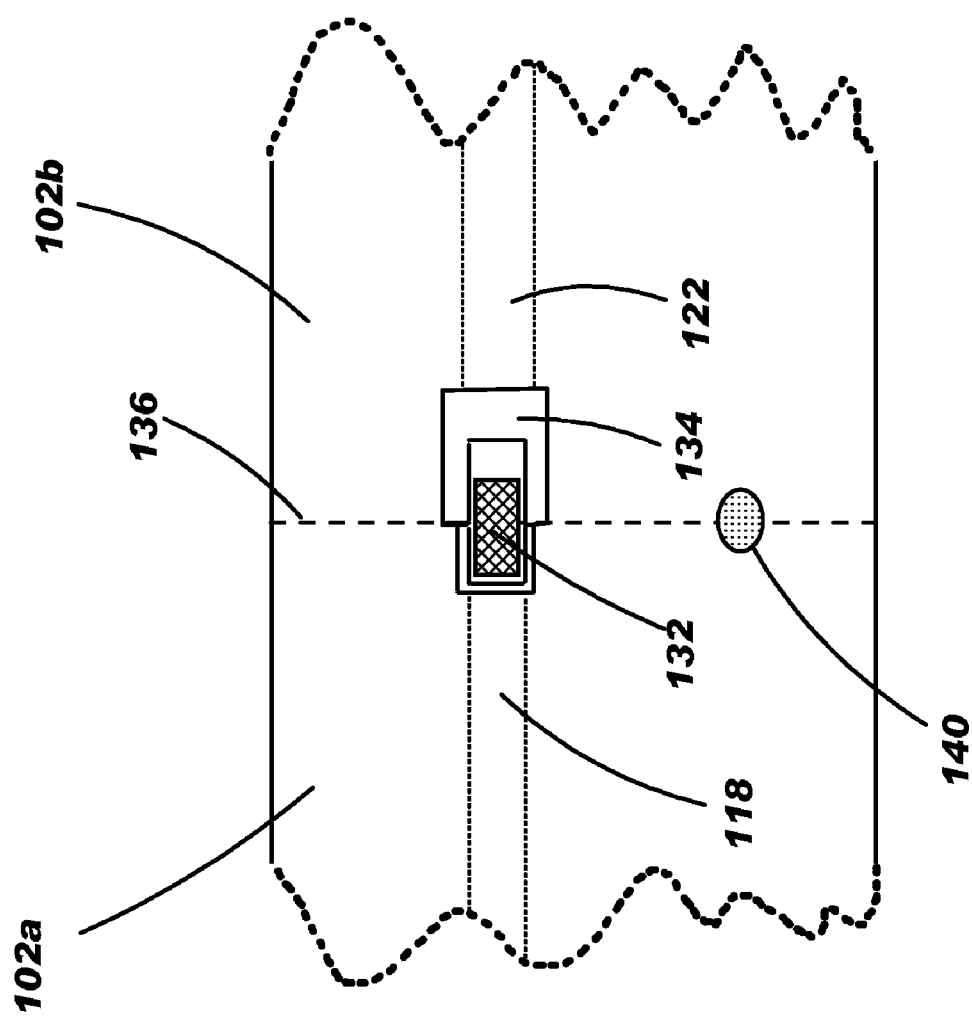
FIG. 4 shows a cross-sectional view of an output conductor of a bushing unit coupled to an input terminal of another bushing unit according to one embodiment of the invention.

FIG. 4 shows a cross-sectional view at the x-z plane (FIG. 2) of output conductor 118 of bushing unit 102*a* coupled to input terminal 122 of bushing unit 102*b*. The dotted curved lines indicate that FIG. 4 shows only a portion of bushing units 102*a* and 102*b*. As shown in FIG. 4, output conductor 118 of bushing unit 102*a* includes an alignment pin 132 to be received/mated to recess 134 of input terminal 122 of bushing unit 102*b*. According to one embodiment, bushing units 102 are similar to one another regarding output conductor 118 and input terminal 122. As such, bushing units 102 can be coupled together to form ion accelerating device 100 of FIG. 2. Adjacent to a contact 136 between each two immediately adjacent bushing units 102, ion accelerating unit 100 includes a high vacuum seal-O-ring 140. As is appreciated, high vacuum seal-O-ring 140 facilitates forming a high vacuum interior environment of ion accelerating device 100 (FIG. 2).

Figure 5:
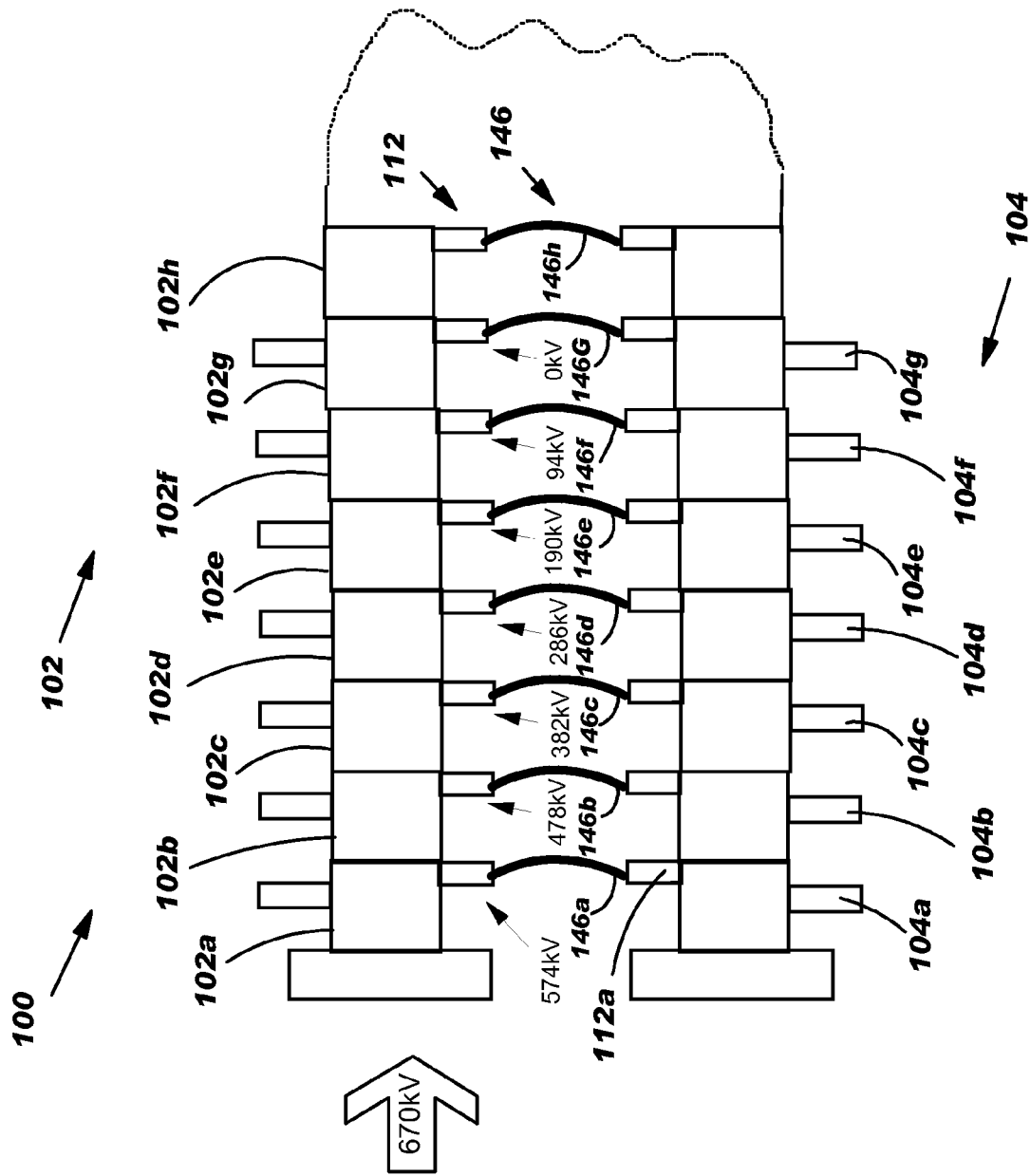
FIG. 5 shows an illustrative example of a stepped voltage degrading according to one embodiment of the invention.

As described above, resistor circuit unit 104 degrades an input voltage by a preset amount. FIG. 5 shows an illustrative example of this stepped voltage degrading achieved by the current invention. In FIG. 5, ion accelerating device 100 is shown in a cross-sectional view in the x-z plane (FIG. 2). For this illustrative example, seven resistor circuit units 104 (104a-104g) are coupled one-to-one to the first seven bushing units 102 (102a-102g), respectively. As such, voltages provided to lenses 146 mounted to bushing units 102 (specifically lens mounting plates 112 of bushing units 102) degrade from bushing unit 102a to bushing unit 102g in a stepped manner. According to one embodiment, the voltages provided to lenses 146 of ion accelerating device 100 grade equally across lenses 146a to 146g. As such, each resistor circuit unit 104 degrades the respective input voltage by the same amount, for example, approximately 95 kV. According to one embodiment, an input voltage of 670 kV is provided to ion accelerating device 100 at the input terminal 122 (shown in FIG. 3) of the first bushing unit 102a. The respective input conductor 114 (shown in FIG. 3) connects this input voltage to the respective resistor circuit unit 104a. Resistor circuit unit 104a degrades the voltage by 96 kV (i.e., approximately 95 kV) and outputs a voltage of 574 kV to lens mounting plate 112a of bushing unit 102a through intermediate conductor 116 (shown in FIG. 3). This voltage of 574 kV is provided to the first lens 146a of first bushing unit 102a. Output of lens mounting plate 112a of bushing unit 102a is connected to input terminal 122 (see FIG. 4) of bushing unit 102b through output conductor 118 (see FIG. 4) of bushing unit 102a, and provides a voltage of 574 kV to bushing unit 102b. The 574 kV voltage supply is then degraded by resistor circuit unit 104b by 96 kV and a voltage of 478 kV is provided to the second lens 146b of second bushing unit 102b. Similarly, lenses 146c to 146g of bushing units 102c to 102g, respectively, receive graded voltages of 382 kV, 286 kV, 190 kV, 94 kV, and 0 kV, respectively. It should be appreciated that the specific voltage numbers provided in the above example are only for illustration purposes and do not limit the scope of the invention.

Bushing units 102 place all voltage paths to the respective lenses inside bushing units 102 (see, e.g., FIG. 3), which greatly simplifies the assembly of ion accelerating device 100. In addition, bushing units 102 can be bolted to one another with no metal flanges in between, which helps to maintain the high vacuum interior environment of ion accelerating device 100 (FIG. 2). Moreover, as lenses are connected as a complete in series electrical circuit with no wires or springs required to make electrical connections with the lenses, it is easier to monitor the voltage supplies to each lens to detect the operating conditions, e.g., a voltage drop out. Other advantages may also be appreciated based on the above described design of ion accelerating device 100, bushing unit 102 and resistor circuit unit 104.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. An ion accelerating device of an ion implantation system, the ion accelerating device comprising:
   a first bushing unit including a first conductor, a second different conductor and a lens mounting plate; and
   a first resistor circuit unit coupled to the first bushing unit;
   wherein the first conductor connects an input terminal of the first bushing unit to an input terminal of the first resistor circuit unit, and the second conductor connects an output terminal of the first resistor circuit unit to an input terminal of the lens mounting plate.

2. The ion accelerating device of claim 1, wherein the first resistor circuit unit degrades an input voltage applied thereto.

3. The ion accelerating device of claim 1, wherein the first resistor circuit unit is mounted onto an exterior of the first bushing unit.

4. The ion accelerating device of claim 1, wherein the first bushing unit further includes a third different conductor coupled to an output terminal of the lens mounting plate.

5. The ion accelerating device of claim 4, further comprising a second bushing unit, wherein the third conductor of the first bushing unit connects directly to an input terminal of the second bushing unit.

6. The ion accelerating device of claim 5, wherein the third conductor of the first busing unit includes a projection portion to mate with a recess portion of the input terminal of the second bushing unit.

7. The ion accelerating device of claim 5, wherein the first busing unit and the second bushing unit physically contact one another directly.

8. The ion accelerating device of claims 5, wherein a second resistor circuit unit is coupled between the input terminal and a lens mounting plate of the second bushing unit, the second resistor circuit unit degrading an output voltage from the lens mounting plate of the first bushing unit by a set amount.

9. The ion accelerating device of claim 8, wherein the second resistor circuit unit degrades the output voltage from the lens mounting plate of the first bushing unit by approximately 95 kV.

10. The ion accelerating device of claim 5, further comprising a seal ring adjacent to a contact between the first busing unit and the second bushing unit.

11. An accelerating column bushing unit, the bushing unit comprising:
    a lens mounting plate; and
    a first conductor and a second different conductor;
    wherein the first conductor connects an input terminal of the bushing unit to an input terminal of a resistor circuit unit coupled to the bushing unit, and the second conductor connects an output terminal of the resistor circuit unit to an input terminal of the lens mounting plate.

12. The bushing unit of claim 11, wherein the resistor circuit unit degrades an input voltage, and outputs a degraded voltage to the lens mounting plate.

13. The bushing unit of claim 12, wherein the resistor circuit unit degrades the input voltage by approximately 95 kV.

14. The bushing unit of claim 11, wherein the resistor circuit unit is mounted onto an exterior of the bushing unit.

15. The bushing unit of claim 11, further comprising a third different conductor, the third conductor including a mating feature capable of mating with the input terminal of the bushing unit and establishing electrical connection therewith.

16. The bushing unit of claim 15, wherein the third conductor includes an alignment pin to mate with a recess portion of the input terminal.

17. A method of providing a voltage supply to a lens in an ion accelerating device, the method comprising:
    providing a series of bushing units and a series of resistor circuit units, each resistor circuit unit coupled to one bushing unit, each bushing unit including a first conductor, a second different conductor and a lens mounting plate;

connecting an input terminal of one bushing unit to an input terminal of a respective resistor circuit unit using the first conductor; and connecting an output terminal of the respective resistor circuit unit to an input terminal of the lens mounting plate of the bushing unit using the second conductor to provide a voltage to a lens installed on the lens mounting plate.

18. The method of claim 17, wherein the respective resistor circuit unit degrades an input voltage, and outputs a degraded voltage to the lens mounting plate.

19. The method of claim 18, wherein the resistor circuit unit degrades the input voltage by approximately 95 kV.

20. The method of claim 17, further comprising connecting a lens mounting plate of a first bushing unit of the series of bushing units to an input terminal of a second bushing unit of the series of bushing units by a third conductor of the first bushing unit to provide a voltage from the first bushing unit to the second bushing unit.

* * * * *